United States Patent
Wang et al.

(10) Patent No.: US 12,373,686 B2
(45) Date of Patent: Jul. 29, 2025

(54) METHODS OF OPERATING AN ARTIFICIAL NEURAL NETWORK USING A COMPUTE-IN-MEMORY ACCELERATOR AND A BITWISE ACTIVATION FUNCTION

(71) Applicant: Samsung Electronics Co., Ltd., Suwon-si (KR)

(72) Inventors: Jing Wang, San Jose, CA (US); Yen-Kai Lin, San Jose, CA (US); Yuanchen Chu, Sunnyvale, CA (US); Woosung Choi, Milpitas, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 891 days.

(21) Appl. No.: 17/525,237

(22) Filed: Nov. 12, 2021

(65) Prior Publication Data

US 2023/0078569 A1    Mar. 16, 2023

Related U.S. Application Data

(60) Provisional application No. 63/242,792, filed on Sep. 10, 2021.

(51) Int. Cl.
*G06N 3/048*  (2023.01)
*G06N 3/065*  (2023.01)
(Continued)

(52) U.S. Cl.
CPC ............... *G06N 3/08* (2013.01); *G06N 3/048* (2023.01); *G06N 3/065* (2023.01); *H03M 1/34* (2013.01)

(58) Field of Classification Search
CPC .......... G06N 3/08; G06N 3/048; G06N 3/065; G06N 3/084; G06F 9/5027; H03M 1/34
See application file for complete search history.

(56) References Cited

U.S. PATENT DOCUMENTS

| | | | |
|---|---|---|---|
| 2019/0042949 A1 | 2/2019 | Young et al. | |
| 2020/0026498 A1* | 1/2020 | Sumbul | G06F 12/0811 |

(Continued)

FOREIGN PATENT DOCUMENTS

| | | |
|---|---|---|
| CN | 112749799 A | 5/2021 |
| WO | 2021067230 A1 | 4/2021 |

*Primary Examiner* — Kuang F Chen
(74) *Attorney, Agent, or Firm* — Myers Bigel, P.A.

(57) ABSTRACT

A method includes providing an artificial neural network comprising a compute-in-memory accelerator, the artificial neural network further comprising a hidden layer including a first plurality of artificial neurons; and training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold, wherein the input comprises a sum, across a second plurality of artificial neurons of a preceding layer of the artificial neural network having a plurality of weights associated therewith, respectively, of a product of an output from a respective one of the second plurality of artificial neurons and one bit of a respective one of the plurality of weights.

14 Claims, 9 Drawing Sheets

(51) Int. Cl.
*G06N 3/08* (2023.01)
*H03M 1/34* (2006.01)

(56) References Cited

U.S. PATENT DOCUMENTS

| | | |
|---|---|---|
| 2020/0311526 A1 | 10/2020 | Kavilipati et al. |
| 2021/0073643 A1 | 3/2021 | Partovi Nia et al. |
| 2022/0414443 A1* | 12/2022 | Li ..................... G06F 7/5443 |
| 2023/0053294 A1* | 2/2023 | Khwa ................ G06F 9/30036 |

* cited by examiner

METHODS OF OPERATING AN ARTIFICIAL NEURAL NETWORK USING A COMPUTE-IN-MEMORY ACCELERATOR AND A BITWISE ACTIVATION FUNCTION

RELATED APPLICATION

The present application claims priority from and the benefit of U.S. Provisional Application No. 63/242,792, filed Sep. 10, 2021, the disclosure of which is hereby incorporated herein by reference in its entirety.

FIELD

The present inventive concepts relate generally to artificial intelligence and, more particularly, to artificial neural networks including a compute-in-memory accelerator.

BACKGROUND

Artificial neural networks are generally based on the same fundamental concepts. The data to be analyzed is broken into elements that can be distributed across an array of nodes, e.g., pixels for an image-recognition task or parameters for a forecasting problem. The artificial neural network may consist of two or more layers of nodes, which can be connected to each other in a variety of different ways.

In a fully connected layer, every node in layer A connects to every node in layer B. In a convolutional layer, in contrast, a filter is defined that assigns a small portion of layer A to each node in layer B. In the example where layers A and B are fully connected, each node in layer A sends its data element to each node in layer B. Each node in layer B multiplies each of the data elements received from the layer A nodes by a respective weight that corresponds to the layer A node from which the data element was received and then sums these products for all of the nodes in layer A. Each node in layer B may then apply an activation function to the summation and forward the output on to the nodes in the next layer. The process repeats for as many layers as there are in the neural network.

The output of the artificial neural network may represent an inference, such as how to assign the input data to the artificial neural network to one of several categories, the answer to a question, or a description of how a system would respond to a given set of input parameters. In supervised learning, the correct final result is known, and errors are used to back-propagate adjustments to the individual weights.

A large artificial neural network may have five or more layers, each with potentially hundreds or thousands of nodes. Thus, while the individual multiply-accumulate (MAC) operations may be relatively simple, they are repeated a large number of times. In a conventional architecture, each MAC operation involves reading the relevant data and weights from memory to the processor, performing the calculation, and writing the result back to memory, which may be processing and energy intensive.

Compute-in-memory (CIM) accelerators seek to address the MAC operation performance bottleneck. In a CIM accelerator, the weights for an entire layer may be stored in the CIM memory array. The input data vectors may be applied to all of the nodes at once, and the results are read from the output lines of the CIM array. In some CIM accelerators, however, after the weighted sum for each neuron is computed, the activation function used in the neural network system may be processed using an arithmetic logic unit (ALU) or additional circuitry dedicated for implementing the activation function. This may increase the total circuit area of the CIM accelerator, increase power consumption, and/or increase delays in generating an inference using the neural network system.

SUMMARY

According to some embodiments of the inventive concept, a method comprises: providing an artificial neural network comprising a compute-in-memory accelerator, the artificial neural network further comprising a hidden layer including a first plurality of artificial neurons; and training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold, wherein the input comprises a sum, across a second plurality of artificial neurons of a preceding layer of the artificial neural network having a plurality of weights associated therewith, respectively, of a product of an output from a respective one of the second plurality of artificial neurons and one bit of a respective one of the plurality of weights.

In other embodiments, respective ones of the plurality of weights comprises a plurality of bits and the bitwise modified rectified linear unit activation function comprises a summation across the plurality of bits of a product of a value of a respective one of the plurality of bits and the output of the bit activation function.

In still other embodiments, the bit activation function is configured to generate a constant output that is independent of the input for input values greater than the critical threshold.

In still other embodiments, the constant output is an inverse of a scaling factor for the plurality of weights.

In still other embodiments, training the artificial neural network comprises: adjusting values of one or more of the critical threshold, the scaling factor, and the plurality of weights based on outputs of the artificial neural network generated in response to a training data set.

In still other embodiments, the method further comprises adjusting one or more parameters of the compute-in-memory accelerator based on the critical threshold.

In still other embodiments, the one or more parameters comprise a voltage pulse width associated with the output from the respective one of the second plurality of artificial neurons, and a plurality of loading capacitances associated with a plurality of output lines respectively corresponding to each of the bit positions of each of the plurality of weights.

In still other embodiments, the compute-in-memory accelerator comprises an analog-to-digital converter coupled to the plurality of output lines, the method further comprising: determining an output voltage (Vout_low) for each of the plurality of output lines when a total number of pulses based on the output from the respective one of the second plurality of artificial neurons and applied to a respective one of the output lines equals the critical threshold; and setting a smallest reference voltage of the analog-to-digital converter approximately equal to Vout_low.

In still other embodiments, the analog-to-digital converter is configured to convert voltage values less than Vout_low to a maximum output.

In still other embodiments, the plurality of outputs from the second plurality of artificial neurons, respectively, and the plurality of weights are non-negative.

In still other embodiments, the method further comprises: operating the artificial neural network in an inference mode responsive to training the artificial neural network. The artificial neural network is configured to generate an output inference responsive to a current data set when in the inference mode.

In some embodiments of the inventive concept, a method comprises: providing an artificial neural network comprising a compute-in-memory accelerator, the artificial neural network further comprising a hidden layer including a first plurality of artificial neurons; and training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold, wherein training the artificial neural network comprises adjusting a value of the critical threshold based on outputs of the artificial neural network generated in response to a training data set.

In further embodiments, the method further comprises adjusting one or more parameters of the compute-in-memory accelerator based on the critical threshold.

In still further embodiments, the one or more parameters comprise a voltage pulse width associated with the output from a respective one of a second plurality of artificial neurons of a preceding layer of the artificial neural network, and a plurality of loading capacitances associated with a plurality of output lines respectively corresponding to each bit position of ones of a plurality of weights associated with the second plurality of artificial neurons, respectively.

In still further embodiments, the compute-in-memory accelerator comprises an analog-to-digital converter coupled to the output lines, the method further comprising: determining an output voltage (Vout_low) for each of the plurality of output lines when a total number of pulses based on the output from the respective one of a second plurality of artificial neurons and applied to a respective one of the output lines equals the critical threshold; and setting a smallest reference voltage of the analog-to-digital converter approximately equal to Vout_low.

In still further embodiments, the input comprises a sum, across a second plurality of artificial neurons of a preceding layer of the artificial neural network having a plurality of weights associated therewith, respectively, of a product of an output from a respective one of the second plurality of artificial neurons and one bit of a respective one of the plurality of weights.

In some embodiments of the inventive concept, a method comprises: providing an artificial neural network comprising a compute-in-memory accelerator, the artificial neural network further comprising a hidden layer including a first plurality of artificial neurons, the compute-in-memory accelerator comprising an analog-to-digital converter coupled to a plurality of output lines respectively corresponding to each bit position of ones of a plurality of weights associated with a second plurality of artificial neurons of a preceding layer of the artificial neural network, respectively; training the artificial neural network using a bitwise modified rectified linear unit activation function for each of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold; determining an output voltage (Vout_low) for each of the plurality of output lines when a total number of pulses applied to a respective one of the output lines equals the critical threshold; and setting a smallest reference voltage of the analog-to-digital converter approximately equal to Vout_low.

In other embodiments, the method further comprises adjusting one or more parameters of the compute-in-memory accelerator based on the critical threshold, wherein the one or more parameters comprise a voltage pulse width associated with the output from a respective one of a second plurality of artificial neurons of a preceding layer of the artificial neural network, and a plurality of loading capacitances associated with a plurality of output lines respectively corresponding to each bit position of ones of a plurality of weights associated with the second plurality of artificial neurons, respectively.

In still other embodiments, the analog-to-digital converter is configured to convert voltage values less than Vout_low to a maximum output.

In still other embodiments, the input comprises a sum, across the second plurality of artificial neurons, respectively, of a product of an output from a respective one of the second plurality of artificial neurons and one bit of a respective one of the plurality of weights.

Other methods, systems, articles of manufacture, and/or computer program products according to embodiments of the inventive concept will be or become apparent to one with skill in the art upon review of the following drawings and detailed description. It is intended that all such additional systems, methods, articles of manufacture, and/or computer program products be included within this description, be within the scope of the present inventive subject matter and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1:
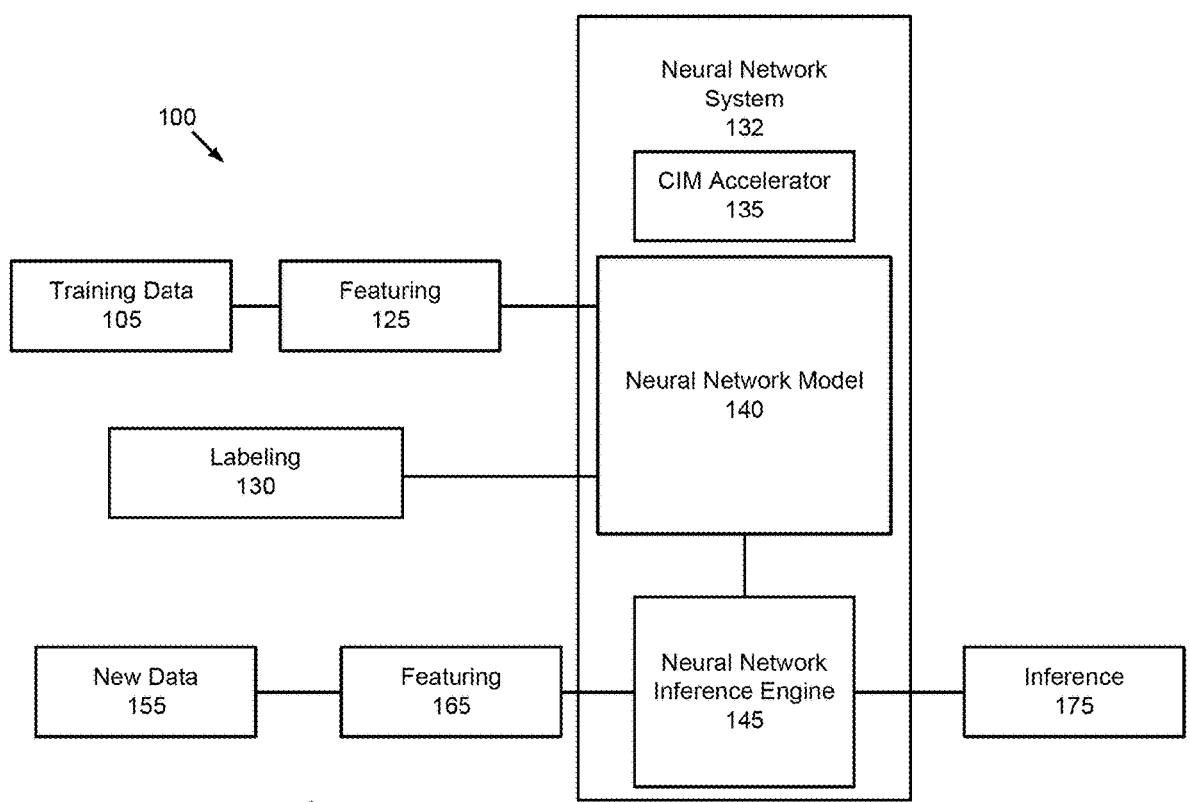
FIG. 1 is a block diagram that illustrates an artificial intelligence system that includes an artificial neural network system including a compute-in-memory accelerator according to some embodiments of the inventive concept.

In the following detailed description, numerous specific details are set forth to provide a thorough understanding of embodiments of the inventive concept. However, it will be understood by those skilled in the art that embodiments of the inventive concept may be practiced without these specific details. In some instances, well-known methods, procedures, components, and circuits have not been described in detail so as not to obscure the inventive concept. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Embodiments of the inventive concept are described herein in the context of an artificial intelligence (AI) system including a multi-layer neural network and compute-in-memory (CIM) accelerator. It will be understood that the multi-layer neural network is a multi-layer artificial neural network comprising artificial neurons or nodes and does not include a biological neural network comprising real biological neurons.

Some embodiments of the inventive concept stem from a realization that conventional CIM accelerators may be used in conjunction with an arithmetic logic unit or additional circuitry to implement the activation function at each node, which uses the multiply-accumulate (MAC) result as input. These CIM accelerators may be used in conjunction with an arithmetic logic unit (ALU) or additional circuitry dedicated for implementing the activation function. This may increase the total circuit area of the CIM accelerator, increase power consumption, and/or increase delays in generating an inference using the artificial neural network system Some embodiments of the inventive concept may provide a modified version of the rectified linear unit (ReLU) activation function in which the activation function is applied at each neuron of a neural network hidden layer in a bitwise fashion corresponding to each bit position of the weight used in the MAC operation. The activation function may be referred to as a bitwise modified ReLU (bm-ReLU) activation function. In some embodiments, the bm-ReLU activation function is configured to generate an output that is proportional to an input when the input is less than a critical threshold and is configured to generate an output that is independent of the input (e.g., a constant output) when the input is greater than the critical threshold.

The artificial neural network may be trained using, for example, available neural network software training platforms to adjust the values of the critical threshold, a scaling factor used for the MAC weights, and/or the MAC weight values. One or more parameters of the CIM accelerator may be adjusted based on the critical threshold. For example, the one or more parameters may include, but are not limited to, a voltage pulse width associated with the output from a preceding layer neuron and loading capacitances associated with a plurality of output lines respectively corresponding to each of the bit positions of the MAC weights.

In some embodiments, the CIM accelerator includes an analog-to-digital converter (ADC) that is coupled to output lines of the CIM accelerator array. As the voltage level of the output line is pulled down with an increasing value of the MAC sum for the weight bit position associated with the output line, an output voltage (Vout_low) may be determined for when a total number of pulses based on the output from a preceding layer neuron is applied to the output line equals the critical threshold. The smallest reference voltage of the ADC may be set to be approximately equal to Vout_low and the ADC may be configured to convert voltage values less than Vout_low to a maximum output.

By adjusting parameters of the CIM accelerator, such as the pulse widths based on the outputs from the preceding layer neurons (inputs to the current layer neuron) and output line loading capacitances, along with such activation function parameters as the critical threshold, MAC weight scaling factor, and the MAC weight values, the bm-ReLU activation function may be implemented without the need for additional circuitry or an additional ALU. As a result, the total CIM accelerator circuit area and CIM accelerator power consumption may be reduced and the processing time for generating an inference using the artificial neural network may also be reduced.

FIG. 1 is a block diagram that illustrates an AI system 100 that includes an artificial neural network system including a CIM accelerator according to some embodiments of the inventive concept. As shown in FIG. 1, the AI system 100 may include both training components and components used for processing new data on which to make inferences or categorizations, for example. The components used in the training portion of the AI system 100 include the training data 105, the featuring component 125, the labeling component 130, and neural network system 132 including the CIM accelerator 135 and the neural network model 140. The training data 105 may comprise information on which the inference or categorization is to be made, e.g., pixel data associated with images, parametric data associated with events, persons, or things, etc. The featuring component 125 is configured to identify the individual independent variables that are used by the AI system 100 to make inferences or categorizations, which may be considered a dependent variable. For example, the training data 105 may be generally unprocessed or formatted and include extra information in addition to relevant information for making the inference or categorization. This additional information may be filtered out by the featuring component 125. The features extracted from the training data 105 may be called attributes and the number of features may be called the dimension. The labeling component 130 may be configured to assign defined labels to the featured training data and to the generated inferences or categorizations to ensure a consistent naming convention for both the input features and the output inferences or categorizations. The neural network model 140 along with the CIM accelerator 135 may process the featured training data 105, including the labels provided by the labeling component 130, and may be configured to test numerous functions to establish a quantitative relationship between the featured and labeled input data and the inference or categorization outputs. The neural network model 140 may use regression techniques to evaluate the effects of various input data features on the inference or categorization outputs where the inference or categorization outputs are designed to improve or maximize a success or accuracy metric. These effects may then be used to tune and refine the quantitative relationship between the featured and labeled input data and the inference or categorization outputs. The tuned and refined quantitative relationship between the featured and labeled input data generated by the neural network model 140 is output for use in the neural network inference engine 145. The neural network model 140 may be referred to as a neural network algorithm.

The components used for processing new or current data on which to make inferences or categorizations include the new data 155, the featuring component 165, the neural network inference engine 145, and the inference component 175. The new data 155 may be the same data/information as the training data 105 in content and form except the new or current data will be used for an actual inference or categorization. Likewise, the featuring component 165 performs the same functionality on the new data 155 as the featuring component 125 performs on the training data 105. The neural network inference engine 145 may, in effect, be generated by the neural network model 140 in the form of the quantitative relationship determined between the featured and labeled input data and the inference outputs. The neural network inference engine 145 may, in some embodiments, be referred to as an AI model or inference model. The neural network inference engine 145 may be configured to output inferences or categorizations via the inference component 175. The inference component 175 may be configured to communicate the inference or categorizations outputs in a variety of display formats.

Figure 2:
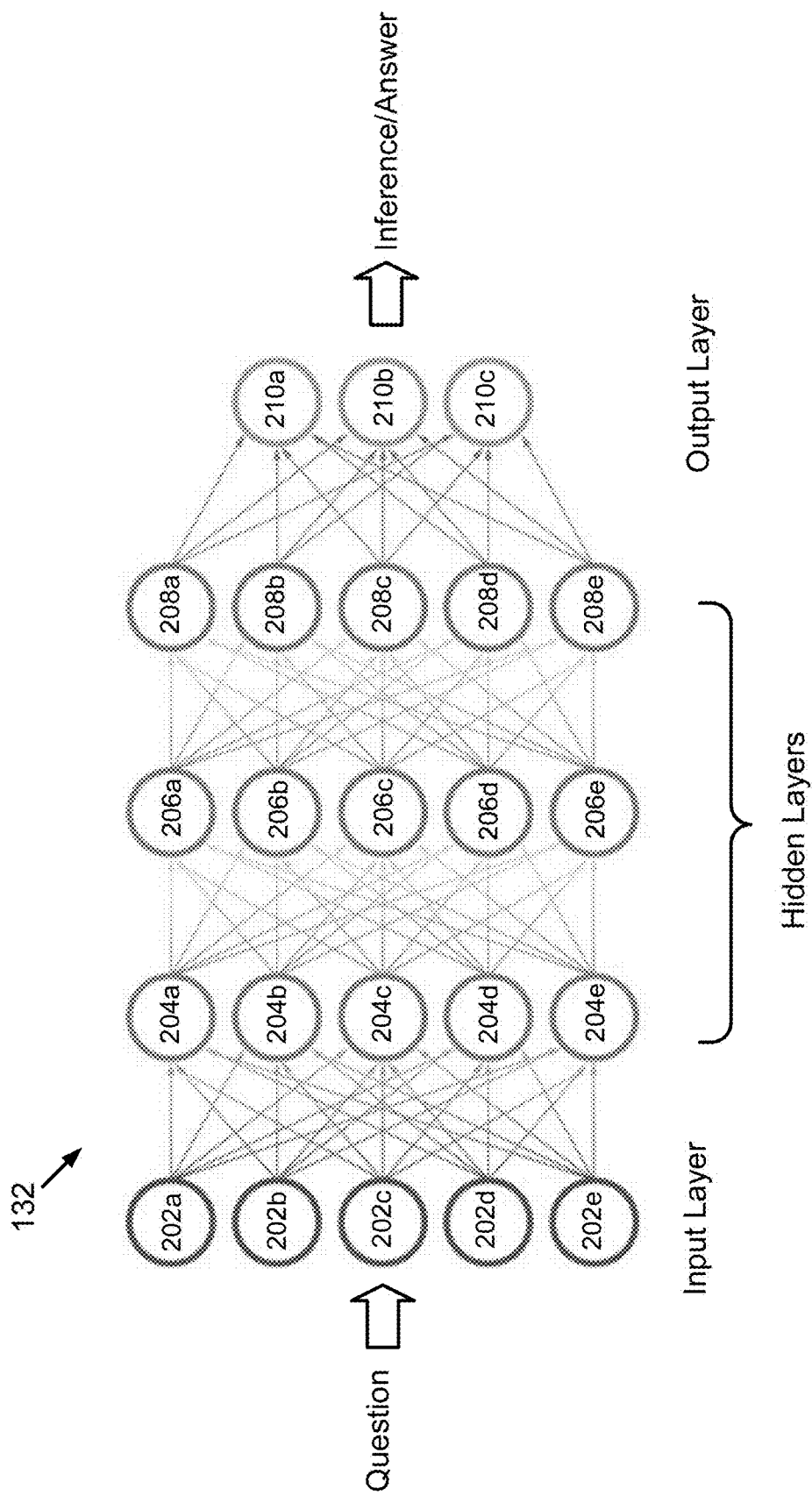
FIG. 2 is a diagram of the artificial neural network system of FIG. 1 according to some embodiments of the inventive concept.

FIG. 2 is a diagram of the artificial neural network system 132 of FIG. 1 according to some embodiments of the inventive concept. As shown in FIG. 2, the artificial neural network 132 includes a plurality of node layers comprising an input layer, one or more hidden layers, and an output layer. In the example shown in FIG. 2, an input layer comprises five nodes or neurons 202a, 202b, 202c, 202d, and 202e and an output layer comprises three nodes or neurons 210a, 210b, and 210c. In the example shown, three hidden layers connect the input layer to the output layer including a first hidden layer comprising five nodes or neurons 204a, 204b, 204c, 204d, and 204e, a second hidden layer comprising five nodes or neurons 206a, 206b, 206c, 206d, and 206e, and a third hidden layer comprising five nodes or neurons 208a, 208b, 208c, 208d, and 208e. Other embodiments may use more or fewer hidden layers. Each node or neuron connects to another and has an associated weight and threshold. If the output of any individual node or neuron is above the specified threshold value, that node is activated, sending data to the next layer of the network. Otherwise, no data is passed along to the next layer of the network.

As described above, the artificial neural network 132 relies on training data to learn and improve its accuracy over time. Once the various parameters of the neural network system 132 are tuned and refined for accuracy, it can be used, among other applications, to generate inferences or answers in response to questions, classify images, recognize and interpret speech, and cluster data, amongst other uses.

Each individual node or neuron may be viewed as implementing a linear regression model, which is composed of input data, weights, a bias (or threshold), and an output. Once an input layer is determined, weights are assigned. These weights help determine the importance of any given variable, with larger ones contributing more significantly to the output compared to other inputs. All inputs are then multiplied by their respective weights and then summed, i.e., a MAC operation. In FIG. 2, node or neuron 206a, for example, receives inputs corresponding to the outputs of nodes or neurons 204a, 204b, 204c, 204d, and 204e. These inputs are multiplied by their corresponding weights and summed at node or neuron 206a. Afterward, the output is passed through an activation function, which determines the output. If that output exceeds a given threshold, it activates the node by passing data to the next layer in the network. This results in the output of one node becoming in the input of the next node. This process of passing data from one layer to the next layer is an example of a feedforward artificial neural network.

Some embodiments of the inventive concept may provide bitwise modified rectified linear unit (bm-ReLU) activation function that may be implemented using the CIM accelerator 135, neural network model 140, and neural network inference engine 145 of FIG. 1 for each node or neuron of an artificial neural network. For a given node or neuron of a hidden layer in the neural network model, the weighted sum z from a MAC operation may be computed as follows where the weights and the inputs received from a preceding layer are non-negative:

$$z = \sum_{i=0}^{N-1} x_i \cdot W_i$$

$x_i$: input, $w_i$: NN weighs, both $x_i$ and $w_i$ are non-negative $N$: no. of neurons in the preceding NN layer Each weight may be stored by $N_{bl}$ bitcells in the CIM accelerator 135 and each bitcell may store $N_{bpc}$ bits. Thus, a weight $w_i$ may be expressed as follows:

$$W_i = \alpha \cdot \sum_{k=0}^{N_{bl}-1} b^k \cdot W_i^{(k)}$$

$b = 2^{N_{bpc}}$ ($b = 2$ for the binary bitcell case)

$w_i^{(m)}$ ($m = 1, \ldots, N_{bl} - 1$):Integer [0, $b - 1$]; $w_i^{(0)}$:float[0, $b$]

$a$: scaling factor, $\alpha > 0$ (e.g., $\alpha = 0.1$)

The weighted sum z may then be expressed as follows:

$$z = \sum_{i=0}^{N-1} X_i \cdot \alpha \cdot \left( \sum_{k=0}^{N_{bl}-1} b^k \cdot W_i^{(k)} \right) = \sum_{k=0}^{N_{bl}-1} b^k \cdot \alpha^2 \cdot \underbrace{\sum_{i=0}^{N-1} \frac{1}{\alpha} X_i \cdot W_i^{(k)}}_{\text{Bitwise weighted sum for bit } k: y^{(k)}}$$

The bitwise weighted sum may be viewed as a summation across a number of nodes or artificial neurons in a preceding layer of the artificial neural network having associated respective weights of a product of an output from a respective one of the preceding layer node or artificial neuron and one bit of the weight associated with that preceding layer node or artificial neuron.

The activation function for a node or artificial neuron, according to some embodiments of the inventive concept, may be expressed as follows where activ corresponds to the output of the current node or artificial neuron and an input for nodes or artificial neurons in a succeeding layer:

$$activ = bmReLU(z) = \alpha^2 \cdot \sum_{k=0}^{N_{bl}-1} b^k \cdot A_{bit}\left(\sum_{i=0}^{N-1} \frac{1}{\alpha} X_i \cdot W_i^{(k)}\right)$$

Figure 3:
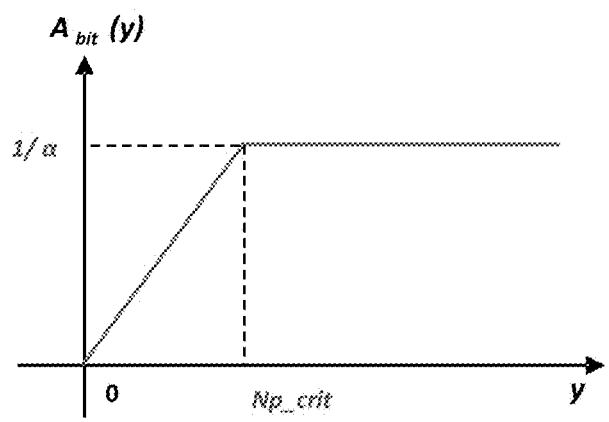
FIG. 3 is a graph that illustrates a bitwise modified rectified linear unit (bm-ReLU) activation function according to some embodiments of the inventive concept.

The bit activation function $A_{bit}$, according to some embodiments of the inventive concept, is shown in FIG. 3 and is based on the bitwise weighted sum for a weight bit described above. The bit activation function is configured to generate an output that is proportional to the input when the input is less than a critical threshold Np_crit and is independent of the input when the input is greater than the critical threshold Np_crit. As shown in FIG. 3, the bit activation function generates a constant output of the inverse of the weight scaling factor α when the input is greater than or equal to the critical threshold Np_crit. The bm-ReLU activation function, according to some embodiments of the inventive concept, generates an output active based on a summation, across the number of bits comprising the weight, of a product of the output of the bit activation function and weight bit value at each weight bit position.

Figure 4:
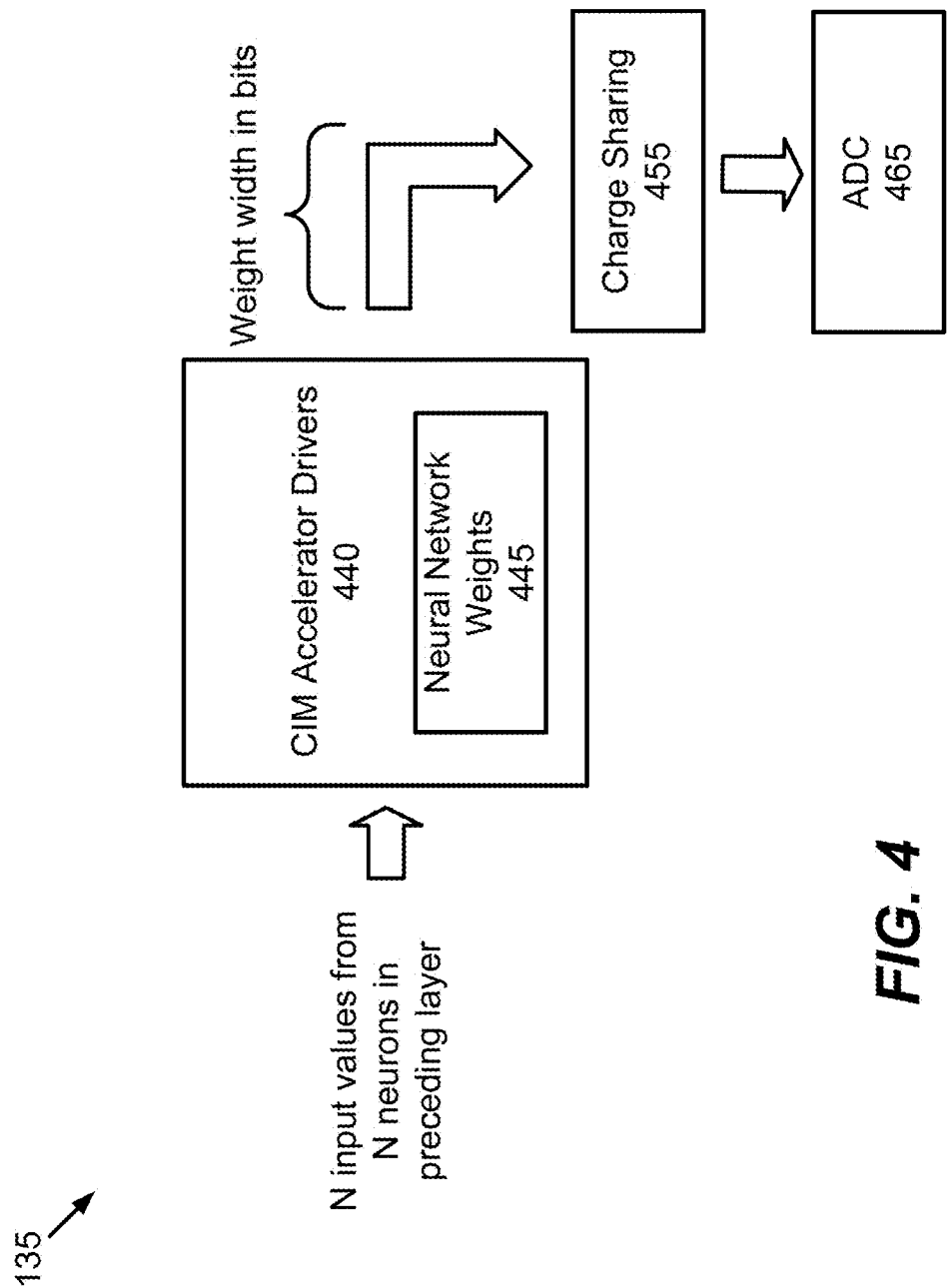
FIGS. 4 and 5 are block diagrams of the compute-in-memory accelerator of FIG. 1 according to some embodiments of the inventive concept.
Figure 5:
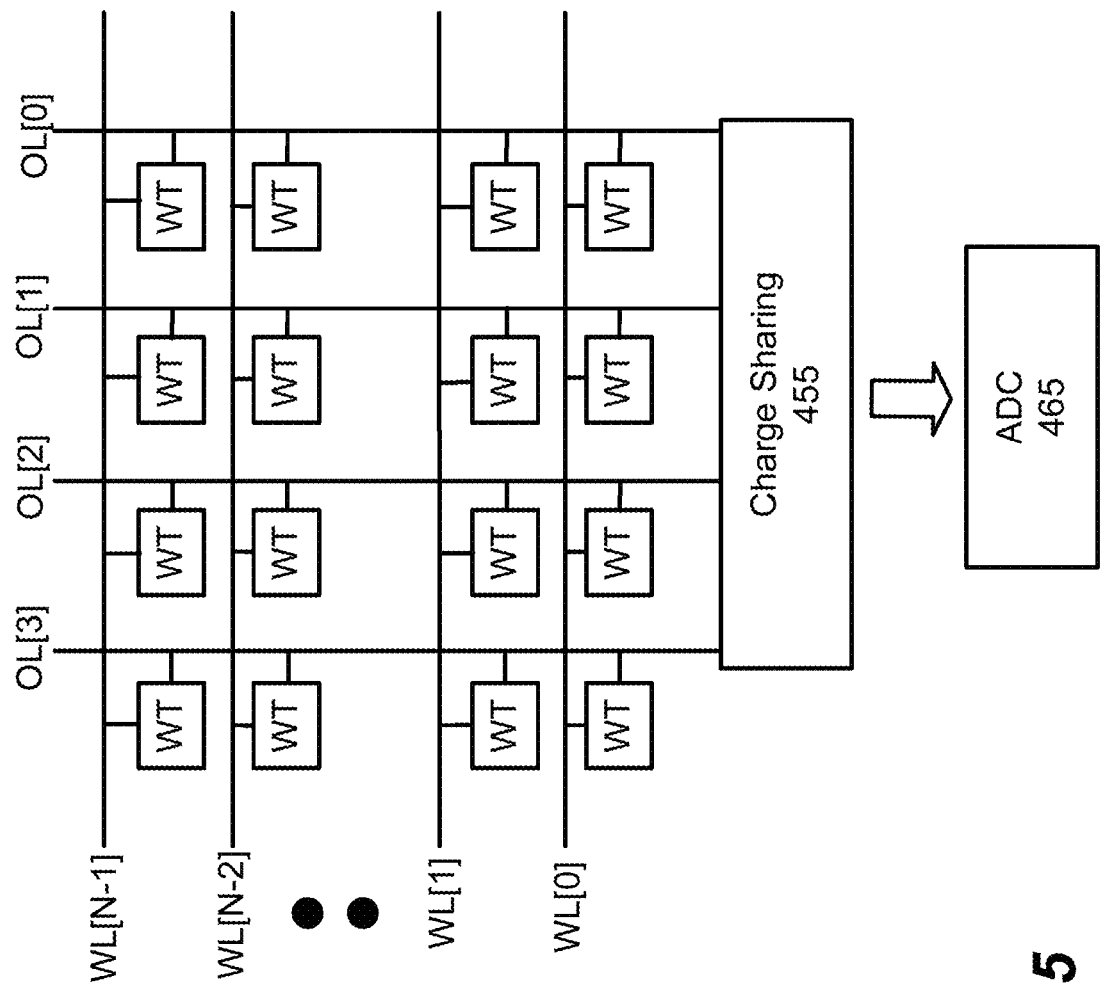

FIGS. 4 and 5 are block diagrams of the CIM accelerator 135 of FIG. 1 according to some embodiments of the inventive concept. As described above, a large artificial neural network may have multiple layers with potentially thousands of nodes. The MAC operations performed at each node or neuron may be both processing and energy intensive. The CIM accelerator 135 may be used to improve the performance of the MAC operations in the neural network system 132 while implementing the bm-ReLU activation function without the need for an additional arithmetic unit or circuitry. As shown in FIG. 4, the CIM accelerator 135 is configured to receive input values that are output from the nodes or neurons of a preceding layer. The CIM accelerator 135 includes CIM accelerator drivers 440 and the neural network weights 445. Through use of the CIM accelerator drivers 440, the input values may be used to drive word lines, which combined with the weight associated with the input value may drive the voltage on an output line lower, for example, when the weight bit is high and the input value bit is high. The charge sharing component 455 is configured to combine the MAC results for each weight bit position, through, for example, a shift-and-add process, and provide the output to the ADC 465. In other embodiments, the shift-and-add process may be performed after the conversion by the ADC 465.

FIG. 5 illustrates operation of the CIM accelerator drivers 440, the neural network weights 445, and the charge sharing component 455 in greater detail. As shown in FIG. 5, assuming each bit cell holding the weight values is binary, then each weight is four bits corresponding to output lines OL[0] . . . . OL[3]. The N inputs to the CIM accelerator 135 for a node or neuron, which correspond to the N outputs generate from a preceding layer of the neural network system 132, are provided on the word lines WL[0] . . . . WL[N−1]. Each input value is pulsed onto its associated word line WL[0] . . . . WL[N−1] and pulls voltage down on the corresponding output line OL[0] . . . . OL[3] based on the value of the pulse and the weight value at each bit position. The charge sharing component 455 may be configured to combine the results for each of the output lines OL[0] . . . . OL[3] corresponding to each bit position, which are then provided to the ADC 465 for conversion. In this way, each input value is multiplied by its associated weight and these products are summed by weight bit position using, for example, the charge sharing component 455.

Figure 6:
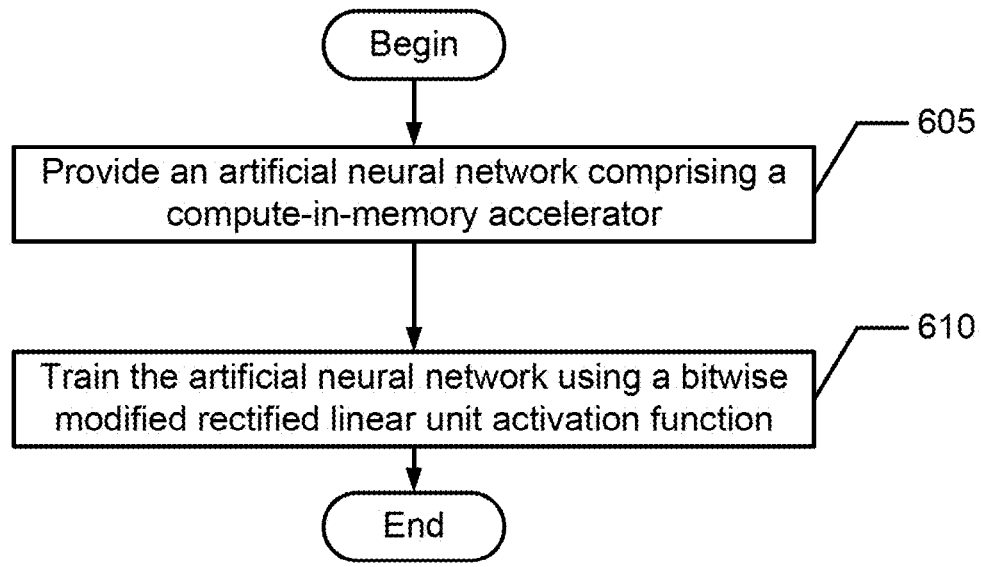
FIGS. 6-9 are flowcharts that illustrate operations of the artificial intelligence system of FIG. 1 including the artificial neural network system and compute-in-memory accelerator according to some embodiments of the inventive concept.

FIGS. 6-9 are flowcharts that illustrate operations of the artificial intelligence system of FIG. 1 including the artificial neural network system 132 and CIM accelerator 135 according to some embodiments of the inventive concept. Referring now to FIG. 6, operations begin at block 605 where an artificial neural network system 132 including a CIM accelerator 135 is provided. The artificial neural network system 132 is trained using the bm-ReLU activation function described above at block 610. In some embodiments, the bm-ReLU activation function comprises a bit activation function as described above with respect to FIG. 3, which is configured to generate an output that is proportional to an input when the input is less than a critical threshold (Np_crit) and configured to generate an output that is independent of the input when the input is greater than the critical threshold. The input may comprise a sum, across a plurality of nodes or artificial neurons of a preceding layer of the artificial neural network 132 and having a plurality of weights associated therewith, respectively, of a product of an output from a respective one of the plurality of nodes or artificial neurons of the preceding layer and one bit of a respective one of the plurality of weights.

Figure 7:
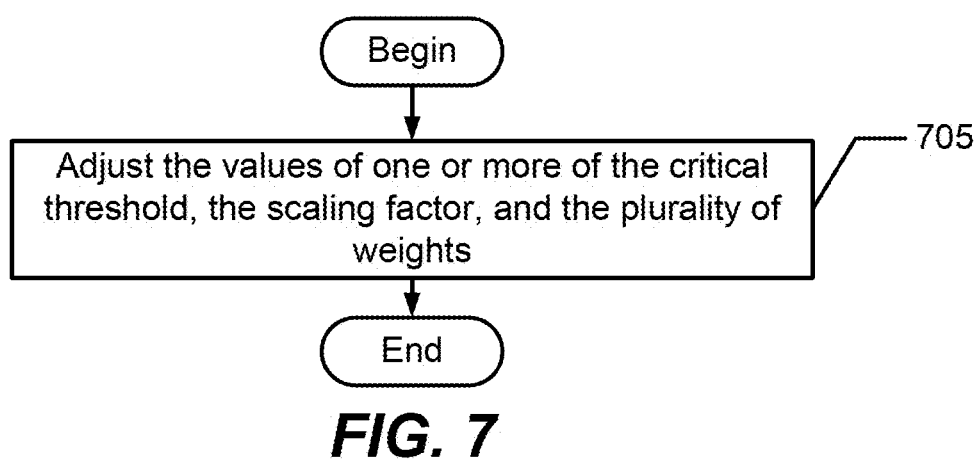

Referring now to FIG. 7, the neural network system 132 may be trained, via an iterative process, for example, to adjust the values of the critical threshold, a scaling factor α used for the MAC weights, and/or the MAC weight values at block 705.

Figure 8:
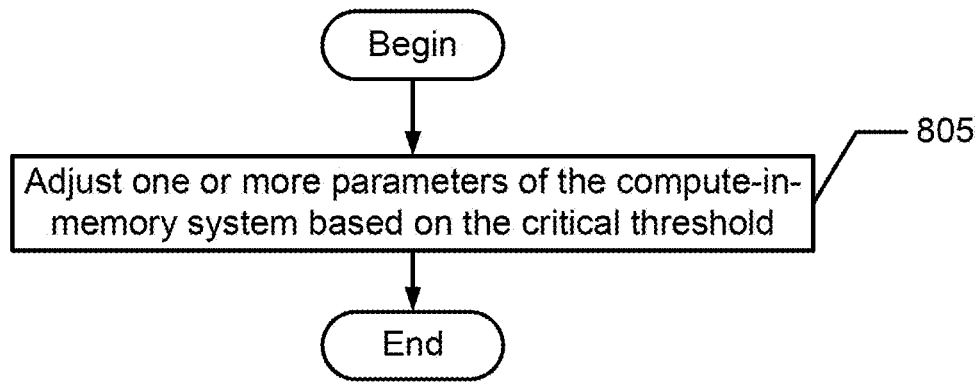

Referring now to FIG. 8, one or more parameters of the CIM accelerator 135 may be adjusted based on the critical threshold Np_crit. For example, the one or more parameters may include, but are not limited to, a voltage pulse width associated with the output from a preceding layer neuron that is pulsed onto its associated word line WL[0] . . . . WL[N−1] of FIG. 5 and loading capacitances associated with a plurality of output lines OL[0] . . . . OL[3] of FIG. 5 respectively corresponding to each of the bit positions of the MAC weights.

Figure 9:
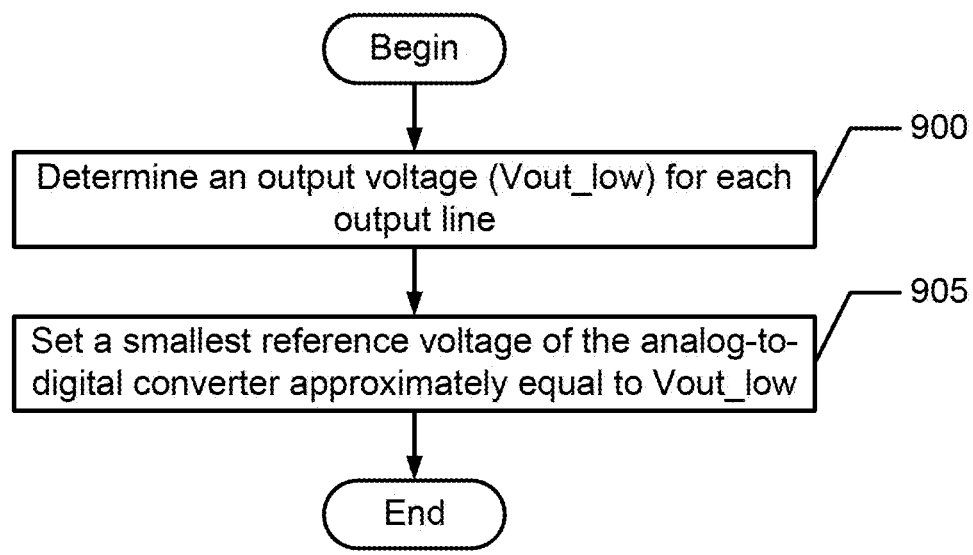

Referring to FIG. 9, the neural network 132 and CIM accelerator 135 may be further tuned by adjusting parameters associated with the ADC 465. For example, as the voltage level of an output line OL[0] . . . . OL[3] of FIG. 5 is pulled down with an increasing value of the MAC sum for the weight bit position associated with the output line OL[0] . . . . OL[3], an output voltage (Vout_low) may be determined at block 900 for when a total number of pulses based on the output from a preceding layer neuron is applied to the output line by way of the corresponding WL[0] . . . . WL[N−1] and weight bit equals the critical threshold Np_crit. The smallest reference voltage of the ADC 465 may be set to be approximately equal to Vout_low at block 905 and the ADC 465 may be configured to convert voltage values less than Vout_low to a maximum output.

Figure 10:
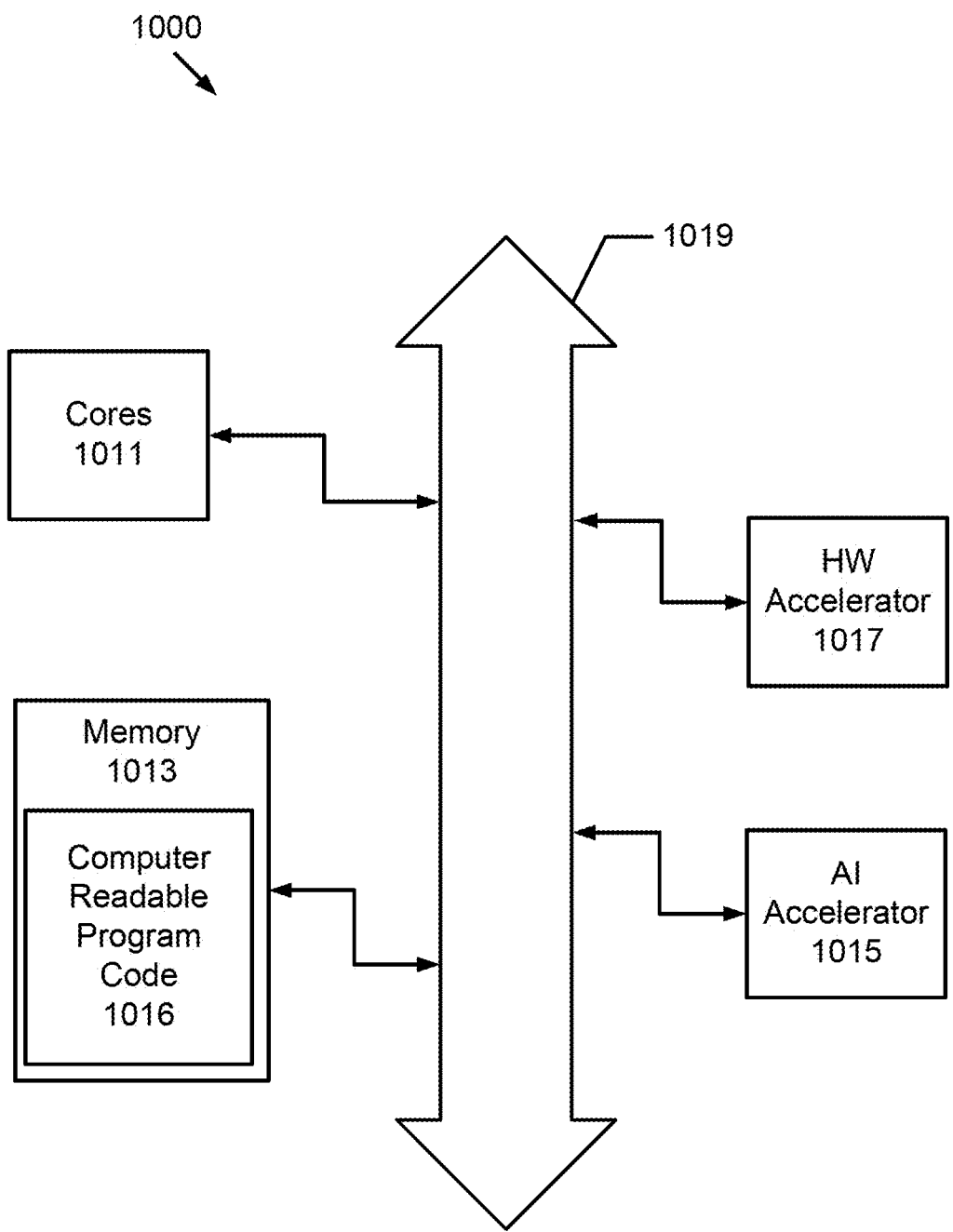
FIG. 10 is a data processing system that may be used to implement an artificial intelligence system including an artificial neural network system and compute-in-memory accelerator according to some embodiments of the inventive concept.

FIG. 10 is a block diagram of a data processing system 1000 that may be used to implement the AI system 100 of FIG. 1 in accordance with some embodiments of the inventive concept. As shown in FIG. 10, the data processing system 1000 may include at least one core 1011, a memory 1013, an Artificial Intelligence (AI) accelerator 1015, and a hardware (HW) accelerator 1017. The at least one core 1011, the memory 1013, the AI accelerator 1015, and the HW accelerator 1017 may communicate with each other through a bus 1019.

The at least one core 1011 may be configured to execute computer program instructions. For example, the at least one core 1011 may execute an operating system and/or applications represented by the computer readable program code 1016 stored in the memory 1013. In some embodiments, the at least one core 1011 may be configured to instruct the AI accelerator 1015 and/or the HW accelerator 1017 to perform operations by executing the instructions and obtain results of the operations from the AI accelerator 1015 and/or the HW accelerator 1017. In some embodiments, the at least one core 1011 may be an ASIP customized for specific purposes and support a dedicated instruction set.

The memory 1013 may have an arbitrary structure configured to store data. For example, the memory 1013 may include a volatile memory device, such as dynamic random-access memory (DRAM) and static RAM (SRAM), or include a non-volatile memory device, such as flash memory and resistive RAM (RRAM). The at least one core 1011, the AI accelerator 1015, and the HW accelerator 1017 may store data in the memory 1013 or read data from the memory 1013 through the bus 1019.

The AI accelerator 1015 may refer to hardware designed for AI applications, such as the CIM accelerator 135. The AI accelerator 1015 may generate output data by processing input data provided from the at least one core 1015 and/or the HW accelerator 1017 and provide the output data to the at least one core 1011 and/or the HW accelerator 1017. In some embodiments, the AI accelerator 1015 may be programmable and be programmed by the at least one core 1011 and/or the HW accelerator 1017. The HW accelerator 1017 may include hardware designed to perform specific operations at high speed. The HW accelerator 1017 may be programmable and be programmed by the at least one core 1011.

Figure 11:
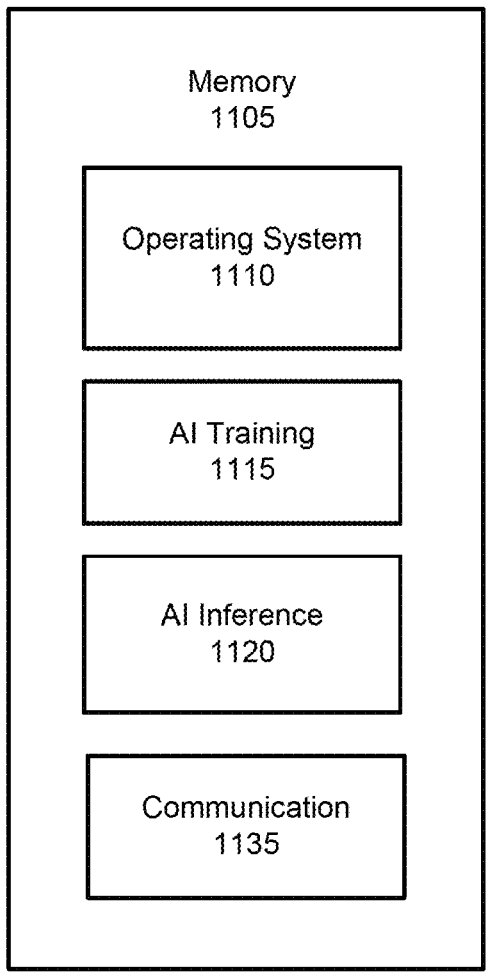
FIG. 11 is a block diagram that illustrates a software/hardware architecture for use in an artificial intelligence system including an artificial neural network system and compute-in-memory accelerator according to some embodiments of the inventive concept.

FIG. 11 illustrates a memory 1105 that may be used in embodiments of data processing systems, such as the AI system of FIG. 1 and the data processing system 1000 of FIG. 10, respectively, to facilitate operation of an AI system 100 including a neural network system 132 and a CIM accelerator 135 configured to use a bn-ReLU activation function according to some embodiments of the inventive concept. The memory 1105 is representative of the one or more memory devices containing the software and data used for facilitating operations of the AI system 100 as described herein. The memory 1105 may include, but is not limited to, the following types of devices: cache, ROM, PROM, EPROM, EEPROM, flash, SRAM, and DRAM. As shown in FIG. 11, the memory 1105 may contain four or more categories of software and/or data: an operating system 1110, an AI training component 1115, and AI inference component 1120, and a communication component 1135. In particular, the operating system 1110 may manage the data processing system's software and/or hardware resources and may coordinate execution of programs by the processor.

The AI training component 1115 may be configured to perform one or more operations as described above with respect to the AI system 100 and the training data 105, the featuring component 125, the labeling component 130, and the neural network model 140. The AI inference component 1120 may be configured to perform one or more operations as described above with respect to the new data component 155, the featuring component 165, the neural network inference engine 145, and the inference component 175. The communication component 1135 may be configured to facilitate receipt of the training data 105, new data 155, and labeling data 130 to the neural network system 132 and to communicate inferences and/or categorizations, for example, to users by way of the inference component 175.

Although FIGS. 10 and 11 illustrate hardware/software architectures that may be used in data processing systems, such as the AI system 100 of FIG. 1 and the data processing system 1000 of FIG. 10 in accordance with some embodiments of the inventive concept, it will be understood that embodiments of the present inventive concept are not limited to such a configuration but is intended to encompass any configuration capable of carrying out operations described herein.

Computer program code for carrying out operations of data processing systems discussed above with respect to FIGS. 1-9 may be written in a high-level programming language, such as Python, Java, C, and/or C++, for development convenience. In addition, computer program code for carrying out operations of the present invention may also be written in other programming languages, such as, but not limited to, interpreted languages. Some components or routines may be written in assembly language or even microcode to enhance performance and/or memory usage. It will be further appreciated that the functionality of any or all of the program components may also be implemented using discrete hardware components, one or more application specific integrated circuits (ASICs), or a programmed digital signal processor or microcontroller.

Moreover, the functionality of the AI system 100 of FIG. 1 and the data processing system 1000 of FIG. 10 may each be implemented as a single processor system, a multi-processor system, a multi-core processor system, or even a network of stand-alone computer systems, in accordance with various embodiments of the inventive concept. Each of these processor/computer systems may be referred to as a "processor" or "data processing system."

The data processing apparatus described herein with respect to FIGS. 1-11 may be used to facilitate operation of an AI system 100 including a neural network system 132 and a CIM accelerator 135 configured to use a bn-ReLU activation function according to some embodiments of the inventive concept described herein. These apparatus may be embodied as one or more enterprise, application, personal, pervasive and/or embedded computer systems and/or apparatus that are operable to receive, transmit, process and store data using any suitable combination of software, firmware and/or hardware and that may be standalone or interconnected by any public and/or private, real and/or virtual, wired and/or wireless network including all or a portion of the global communication network known as the Internet, and may include various types of tangible, non-transitory computer readable media. In particular, the memory 1105 when coupled to a processor includes computer readable program code that, when executed by the processor, causes the processor to perform operations including one or more of the operations described herein with respect to FIGS. 1-9.

Some embodiments of the inventive concept may provide an AI system including an artificial neural network that uses a CIM accelerator to improve performance of the MAC operations. Moreover, adjustment and tuning of the parameters of the CIM accelerator, such as the pulse widths based on the outputs from the preceding layer neurons (inputs to the current layer neuron) and output line loading capacitances, along with such activation function parameters as the critical threshold Np_crit, MAC weight scaling factor $\alpha$, and the MAC weight values may be performed to implement a bm-ReLU activation function without the need for additional circuitry or an additional ALU. Classification experiments based on neural networks with one hidden layer having 16 neurons and one hidden layer having 28 neurons have resulted in less than a 10% accuracy penalty when using a bm-ReLU activation function, according to some embodiments of the inventive concept described herein, relative to non-bitwise activation functions, such as sigmoid and tanh. Thus, some embodiments of the inventive concept may provide an AI system including an artificial neural network in which a CIM accelerator is combined with the artificial neural network to implement a bm-ReLU activation function without increasing the CIM accelerator circuit area while reducing the CIM accelerator power consumption. Moreover, processing time for generating an inference or categorization using the artificial neural network may be reduced.

FURTHER DEFINITIONS AND EMBODIMENTS

In the above-description of various embodiments of the present inventive concept, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense expressly so defined herein.

The flowchart and block diagrams in the figures illustrate the architecture, functionality, and operation of possible implementations of systems, methods, and computer program products according to various aspects of the present inventive concept. In this regard, each block in the flowchart or block diagrams may represent a component, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

In the above-description of various embodiments of the present inventive concept, aspects of the present inventive concept may be illustrated and described herein in any of a number of patentable classes or contexts including any new and useful process, machine, manufacture, or composition of matter, or any new and useful improvement thereof.

Accordingly, aspects of the present inventive concept may be implemented entirely hardware, entirely software (including firmware, resident software, micro-code, etc.) or combining software and hardware implementation that may all generally be referred to herein as a "circuit," "module," "component," or "system." Furthermore, aspects of the present inventive concept may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

The description of the present inventive concept has been presented for purposes of illustration and description, but is not intended to be exhaustive or limited to the inventive concept in the form disclosed. Many modifications and variations will be apparent to those of ordinary skill in the art without departing from the scope and spirit of the inventive concept. The aspects of the inventive concept herein were chosen and described to best explain the principles of the inventive concept and the practical application, and to enable others of ordinary skill in the art to understand the inventive concept with various modifications as are suited to the particular use contemplated.

What is claimed is:

1. A method, comprising:
providing an artificial neural network comprising a compute-in-memory accelerator, the artificial neural network further comprising a hidden layer including a first plurality of artificial neurons; and
training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold,
wherein the input comprises a sum, across a second plurality of artificial neurons of a preceding layer of the artificial neural network having a plurality of weights associated therewith, respectively, of a product of an output from a respective one of the second plurality of artificial neurons and one bit of a respective one of the plurality of weights, and wherein generating the sum comprises charge sharing between a plurality of output lines corresponding to respective bit positions of the plurality of weights;
wherein training the artificial neural network comprises:
adjusting, based on outputs of the artificial neural network generated in response to a training data set, one or more parameters of the compute-in-memory accelerator, wherein the one or more parameters comprise: a voltage pulse width associated with the output from the respective one of the second plurality of artificial neurons, a plurality of loading capacitances associated with the plurality of output lines respectively, or a combination thereof.

2. The method of claim 1, wherein respective ones of the plurality of weights comprises a plurality of bits, and
wherein the bitwise modified rectified linear unit activation function comprises a summation across the plurality of bits of a product of a value of a respective one of the plurality of bits and the output of the bit activation function.

3. The method of claim 2, wherein the bit activation function is configured to generate a constant output that is independent of the input for input values greater than the critical threshold.

4. The method of claim 3, wherein the constant output is an inverse of a scaling factor for the plurality of weights.

5. The method of claim 1, wherein the compute-in-memory accelerator comprises an analog-to-digital converter coupled to the plurality of output lines, the method further comprising: determining an output voltage (Vout_low) for each of the plurality of output lines when a total number of pulses based on the output from the respective one of the second plurality of artificial neurons and applied to a respective one of the output lines equals the critical threshold; and setting a smallest reference voltage of the analog-to-digital converter approximately equal to Vout_low.

6. The method of claim 5, wherein the analog-to-digital converter is configured to convert voltage values less than Vout_low to a maximum output.

7. The method of claim 1, wherein the plurality of outputs from the second plurality of artificial neurons, respectively, and the plurality of weights are non-negative.

8. The method of claim 1, further comprising:
operating the artificial neural network in an inference mode responsive to training the artificial neural network,
wherein the artificial neural network is configured to generate an output inference responsive to a current data set when in the inference mode.

9. A method, comprising:
providing an artificial neural network comprising a compute-in-memory accelerator, the artificial neural network further comprising a hidden layer including a first plurality of artificial neurons; and
training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold, and wherein the input is generated by charge sharing between a plurality of output lines corresponding to respective bit positions of a plurality of weights, the plurality of weights being associated with a second plurality of artificial neurons of a preceding layer of the artificial neural network;
wherein training the artificial neural network comprises adjusting a value of the critical threshold based on outputs of the artificial neural network generated in response to a training data set and adjusting one or more parameters of the compute-in-memory accelerator based on the critical threshold, wherein the one or more parameters comprise a voltage pulse width associated with an output from a respective one of the second plurality of artificial neurons of a preceding layer of the artificial neural network, and a plurality of loading capacitances associated with the plurality of output lines respectively.

10. The method of claim 9, wherein the compute-in-memory accelerator comprises an analog-to-digital converter coupled to the output lines, the method further comprising: determining an output voltage (Vout_low) for each of the plurality of output lines when a total number of pulses based on the output from the respective one of the second plurality of artificial neurons and applied to a respective one of the output lines equals the critical threshold; and setting a smallest reference voltage of the analog-to-digital converter approximately equal to Vout_low.

11. The method of claim 9, wherein the input comprises a sum, across the second plurality of artificial neurons of the preceding layer of the artificial neural network having the plurality of weights associated therewith, respectively, of a product of an output from a respective one of the second plurality of artificial neurons and one bit of a respective one of the plurality of weights.

12. A method, comprising:
providing an artificial neural network comprising a compute-in-memory accelerator, the artificial neural network further comprising a hidden layer including a first plurality of artificial neurons, the compute-in-memory accelerator comprising an analog-to-digital converter coupled to a plurality of output lines respectively corresponding to each bit position of ones of a plurality of weights associated with a second plurality of artificial neurons of a preceding layer of the artificial neural network, respectively;
training the artificial neural network using a bitwise modified rectified linear unit activation function for ones of the first plurality of artificial neurons, the bitwise modified rectified linear unit activation function comprising a bit activation function, which is configured to generate an output that is proportional to an input when the input is less than a critical threshold and configured to generate an output that is independent of the input when the input is greater than the critical threshold;
determining an output voltage (Vout_low) for each of the plurality of output lines when a total number of pulses applied to a respective one of the output lines equals the critical threshold; and setting a smallest reference voltage of the analog-to-digital converter approximately equal to Vout_low,
wherein the input is generated by charge sharing between a plurality of output lines corresponding to respective bit positions of the plurality of weights;
adjusting one or more parameters of the compute-in-memory accelerator based on the critical threshold, wherein the one or more parameters comprise a voltage pulse width associated with an output from a respective one of the second plurality of artificial neurons of the preceding layer of the artificial neural network, and a plurality of loading capacitances associated with the plurality of output lines respectively.

13. The method of claim 12, wherein the analog-to-digital converter is configured to convert voltage values less than Vout_low to a maximum output.

14. The method of claim 12, wherein the input comprises a sum, across the second plurality of artificial neurons, respectively, of a product of an output from a respective one of the second plurality of artificial neurons and one bit of a respective one of the plurality of weights.

* * * * *